(12) United States Patent
Nishiyama (10) Patent No.: US 9,449,792 B2
(45) Date of Patent: Sep. 20, 2016

(54) CHARGED PARTICLE BEAM WRITING APPARATUS, APERTURE UNIT, AND CHARGED PARTICLE BEAM WRITING METHOD

(71) Applicant: NuFlare Technology, Inc., Yokohama (JP)

(72) Inventor: Tetsuro Nishiyama, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/193,182

(22) Filed: Feb. 28, 2014

(65) Prior Publication Data

US 2014/0273536 A1 Sep. 18, 2014

(30) Foreign Application Priority Data

Mar. 12, 2013 (JP) ................. 2013-048756

(51) Int. Cl.
| | |
|---|---|
| *H01L 21/00* | (2006.01) |
| *H01J 37/317* | (2006.01) |
| *H01J 37/09* | (2006.01) |
| *H01L 21/263* | (2006.01) |

(52) U.S. Cl.
CPC ............ *H01J 37/3174* (2013.01); *H01J 37/09* (2013.01); *H01L 21/2636* (2013.01); *H01J 2237/022* (2013.01); *H01J 2237/0451* (2013.01)

(58) Field of Classification Search
CPC ...................... H01J 37/3174; H01J 2237/0451
USPC ......................................................... 438/798
See application file for complete search history.

(56) References Cited

U.S. PATENT DOCUMENTS

| | | | | |
|---|---|---|---|---|
| 2006/0231773 A1* | 10/2006 | Katagiri | .................. | H01J 41/02 250/492.1 |
| 2008/0315122 A1* | 12/2008 | Katagiri | .................. | H01J 37/18 250/492.1 |
| 2010/0224778 A1 | 9/2010 | Muray et al. | | |
| 2012/0196440 A1* | 8/2012 | Botman | .................. | C23C 16/10 438/676 |

FOREIGN PATENT DOCUMENTS

| | | |
|---|---|---|
| JP | 56-54744 | 5/1981 |
| JP | 2-215199 | 8/1990 |
| JP | 9-134861 | 5/1997 |
| JP | 11-162811 | 6/1999 |
| JP | 2006-108119 A | 4/2006 |
| KR | 10-2004-0005951 A | 1/2004 |

OTHER PUBLICATIONS

Korean Office Action issued Aug. 17, 2015 in Patent Application No. 10-2014-0022091 (with English language translation).

(Continued)

*Primary Examiner* — Brook Kebede
(74) *Attorney, Agent, or Firm* — Oblon, McClelland, Maier & Neustadt, L.L.P.

(57) ABSTRACT

A charged particle beam writing apparatus according to an embodiment includes: a beam emitter configured to emit a charged particle beam; an aperture having an opening portion through which the charged particle beam emitted by the beam emitter passes; an aperture beam tube being provided on a surface of the aperture and functioning as a thermally conductive member having thermal conductivity; and a heater provided on a surface of the aperture beam tube and configured to supply heat to the aperture via the aperture beam tube.

19 Claims, 5 Drawing Sheets

(56) References Cited

OTHER PUBLICATIONS

Office Action issued Mar. 17, 2015 in Korean Patent Application No. 10-2014-0022091.

Office Action issued Oct. 20, 2015 in Korean Patent Application No. 10-2014-0022091 (with English translation).

Office Action mailed Jun. 28, 2016 in Japanese Application No. 2013-048756 filed Mar. 12, 2013 (w/English translation).

* cited by examiner

CHARGED PARTICLE BEAM WRITING APPARATUS, APERTURE UNIT, AND CHARGED PARTICLE BEAM WRITING METHOD

CROSS-REFERENCE TO THE RELATED APPLICATION

This application is based on and claims the benefit of priority from Japanese Patent Application No. 2013-048756, filed on Mar. 12, 2013; the entire contents of which are incorporated herein by reference.

FIELD

Embodiments described herein relate generally to a charged particle beam writing apparatus, an aperture unit, and a charged particle beam writing method.

BACKGROUND

With an increase in the density and capacity of large-scale integrated circuits (LSIs) in recent years, semiconductor devices are required to have an even thinner circuit line width. A lithographic technique is used to form a desired pattern on a semiconductor device. In the lithographic technique, pattern transfer which uses an original pattern called a mask (or reticle) is performed. The manufacturing of a high-precision mask used for this pattern transfer uses a charged particle beam writing apparatus with excellent resolution.

This charged particle beam writing apparatus typically uses apertures (shaping apertures) to shape a charged particle beam. To be more specific, a circuit pattern to be transferred onto a wafer is decomposed into multiple basic figures, and multiple apertures are used to shape a charged particle beam into the same shape and size as each basic figure. Then, the charged particle beam thus shaped is applied to a resist to write a pattern.

A variable shaped beam (VSB) method is one of the methods for shaping the charged particle beam. In this method, rectangular, triangular, and trapezoid patterns are inputted as the basic figures, and a charged particle beam is shaped into desired size and shape, such as a rectangle or a triangle, by control of the overlap amount of two apertures having opening portions through which the charged particle beam passes.

Such a charged particle beam writing apparatus has a contamination problem caused by carbon and the like existing in the atmosphere. The atmosphere inside the charged particle beam writing apparatus is sometimes contaminated by a component which is not supposed to exist there under normal circumstances. For this reason, when the charged particle beam writing apparatus is operated for a long time, contaminants originating from the component described above might be attached to the opening portion of each aperture (to change the shape of the opening) and consequently change the shape or size of the charged particle beam. This change in the shape or size of the charged particle beam results in a decrease in writing precision.

To overcome this contamination problem, the following charged particle beam writing apparatus has been proposed. Specifically, attachment of contaminants to the surface of the aperture is measured by a film thickness measurement device or an elemental analyzer. Then, when contaminants in a predetermined amount or more are attached, the contaminants are removed through heating with a heater or etching with oxygen plasma or ion beams.

In other words, this charged particle beam writing apparatus configured to measure the attachment of contaminants to the surface of the aperture permits attachment of contaminants up to the predetermined amount. However, even a small amount of contaminants attached to the opening portion of the aperture during writing changes the shape or size of the charged particle beam and thus decreases the writing precision.

Moreover, since the temperature of the aperture needs to be brought to a high temperature of several hundred degrees (e.g., 200° C.) to prevent the contamination, a large amount of current is passed to the heater during writing. If the charged particle beam is deflected due to an influence of a magnetic field produced by the heater in that state, the writing position is shifted, which lowers the writing precision. For this reason, the influence of the magnetic field thus produced needs to be diminished by reducing the current passed to the heater during writing. However, reducing the current in turn decreases the amount of heat produced by the heater, and this makes it difficult to bring the temperature of the aperture to the high temperature of several hundred degrees.

In addition, if the heater (heating wire) is provided directly on the surface of the aperture to bring the temperature of the aperture to the high temperature of several hundred degrees, current flows through the aperture as well. Then, if the charged particle beam is deflected due to an influence of a magnetic field produced by the aperture, the writing position is shifted, which lowers the writing precision, as similar to the above case.

DETAILED DESCRIPTION

According to one embodiment of the present invention, a charged particle beam drawing apparatus includes: a beam emitter configured to emit a charged particle beam; an aperture having an opening portion through which the charged particle beam emitted by the beam emitter passes; a thermally conductive member provided on a surface of the aperture and having thermal conductivity; and a heater provided on a surface of the thermally conductive member and configured to supply heat to the aperture via the thermally conductive member.

According to another embodiment, an aperture unit includes: an aperture having an opening portion through which a charged particle beam passes; a thermally conductive member being provided on a surface of the aperture and having thermal conductivity; and a heater provided on a surface of the thermally conductive member and configured to supply heat to the aperture via the thermally conductive member.

According to another embodiment, a charged particle beam drawing method includes: supplying heat to an aperture via a thermally conductive member having thermal conductivity, the aperture having an opening portion through which a charged particle beam passes; and applying a charged particle beam to the opening portion of the aperture being supplied with the heat.

An embodiment is described below with reference to the drawings.

Figure 1:
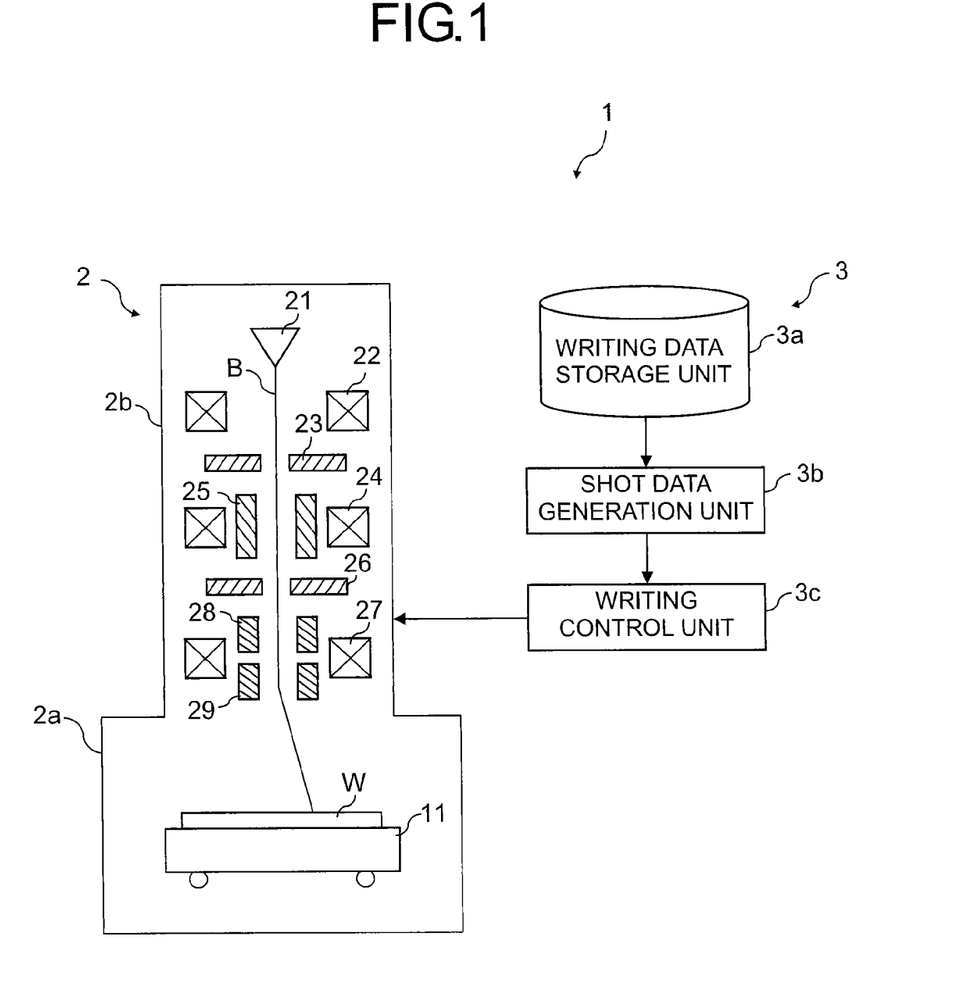
FIG. 1 is a diagram showing the schematic configuration of a charged particle beam writing apparatus according to an embodiment.

As shown in FIG. 1, a charged particle beam writing apparatus 1 according to an embodiment includes a writing unit 2 configured to perform writing by use of a charged particle beam and a controller 3 configured to control the writing unit 2. This charged particle beam writing apparatus 1 is an example of a variable shaped beam writing apparatus using, for example, an electron beam as a charged particle beam. Note that the charged particle beam is not limited to the electron beam, but may be other charged particle beams such as an ion beam.

The writing unit 2 has a writing chamber 2a accommodating a sample W which is a writing target and an optical lens barrel 2b communicating with the writing chamber 2a. The optical lens barrel 2b is provided above the writing chamber 2a and configured to shape and deflect an electron beam and irradiate the sample W in the writing chamber with the electron beam. During this, the writing chamber 2a and the optical lens barrel 2b are both depressurized inside to be in a vacuum.

A stage 11 for supporting the sample W is provided inside the writing chamber 2a. This stage 11 is provided with a motion capability to be able to move, on a horizontal plane, in an X-axis direction and a Y-axis direction orthogonal to each other (called simply an X direction and a Y direction hereinbelow). The sample W such as a mask or a black, for example, is placed on a placement surface of the stage 11.

Placed inside the optical lens barrel 2b are a beam emitter 21, such as an electron gun, configured to emit an electron beam B, an illumination lens 22 configured to condense the electron beam B, a first aperture 23 for beam shaping, a projector lens 24 for projection, a shaping deflector 25 for beam shaping, a second aperture 26 for beam shaping, an objective 27 configured to focus the beam on the sample W, and a secondary deflector 28 and a primary reflector 29 configured to control the shot position of the beam on the sample W.

Figure 2:
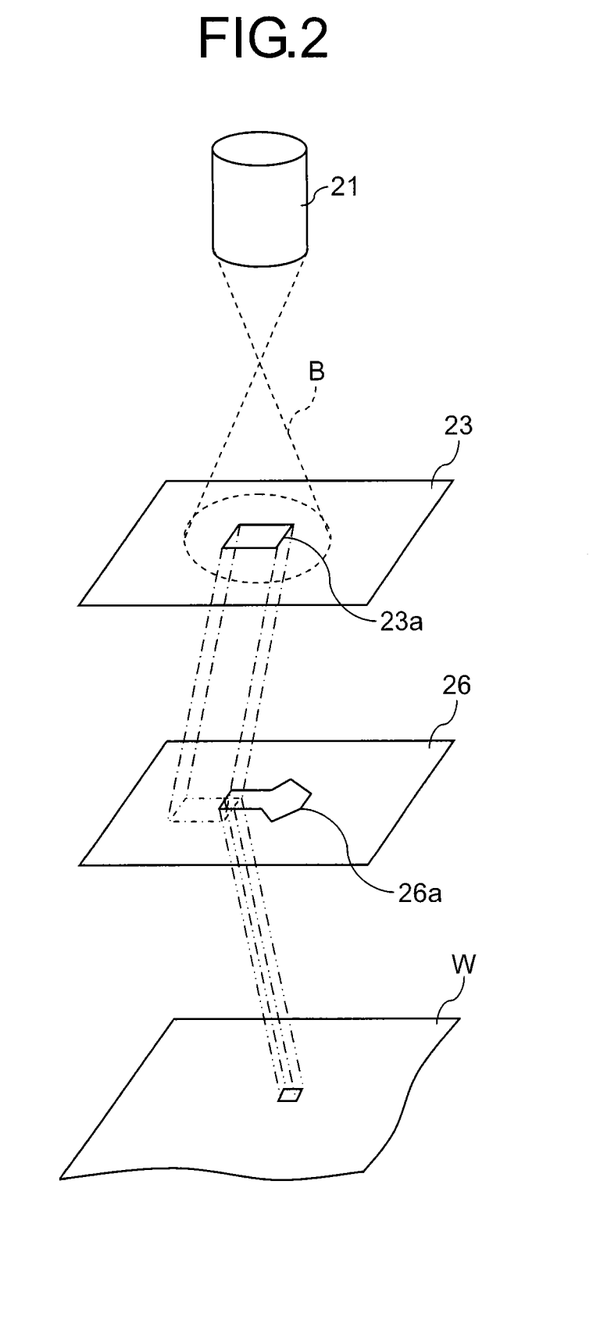
FIG. 2 is a diagram illustrating shaping of a charged particle beam according to the embodiment.

As shown in FIG. 2, the first aperture 23 has an opening portion 23a which is, for example, rectangular. In addition, the second aperture 26 has an opening portion 26a for variable shaping configured to shape the electron beam B having passed through the opening portion 23a into desired shape (e.g., such as a rectangle or a triangle) and size.

In this writing unit 2, as shown in FIGS. 1 and 2, the electron beam B is emitted from the beam emitter 21 and applied to the first aperture 23 by the illumination lens 22. Then, this electron beam B passes through the opening portion 23a of the first aperture 23 and is projected on the second aperture 26 by the projector lens 24. The projected electron beam B further passes through the opening portion 26a of the second aperture 26, and thereby has its section shaped into the desired shape and size. In this event, the shaping deflector 25 can change the position of the projection described above, and the shape and size of the electron beam B can be controlled by this change in the projection position. The electron beam B having passed through the second aperture 26 is then focused on and applied to the sample W on the stage 11 by the objective lens 27. In this event, the shot position of the electron beam B on the sample W placed on the stage 11 can be changed by the secondary deflector 28 and the primary deflector 29.

The controller 3 includes a writing data storage unit 3a configured to store writing data, a shot data generation unit 3b configured to generate shot data by processing the writing data, and a writing control unit 3c configured to control the writing unit 2. Note that the shot data generation unit 3b and the writing control unit 3c may be configured with hardware such as electric circuits or software such as programs for executing each function, or may be configured by a combination of both.

The writing data storage unit 3a is a storage unit configured to store writing data for writing a pattern on the sample W. This writing data is data obtained by converting layout data created by a semiconductor integrated circuit designer or the like into the format supported by the charged particle beam writing apparatus 1 so that the layout data can be inputted to the charged particle beam writing apparatus 1, and the writing data is inputted from an external device to the writing data storage unit 3a and stored therein. For example, a magnetic disk device, a semiconductor disk device (flash memory), or the like can be used as the writing data storage unit 3a.

Here, the layout data described above usually includes many minute patterns (such as figures), and is fairly heavy. Thus, if this layout data is directly converted into another format, the amount of data after the conversion increases even more. For this reason, the writing data is reduced in its data amount by a method such as data stratification or array display of patterns. For example, the writing data is stratified into a chip layer, a frame layer under the chip layer, a block layer under the frame layer, a cell layer under the block layer, and a graphics layer under the cell layer (stratum structure).

The shot data generation unit 3b divides a writing pattern defined by the writing data into multiple stripe regions (whose long side is along the X direction, and short side is along the Y direction), and further divides each of the stripe region into many sub regions in matrix. In addition, the shot data generation unit 3b generates shot data by determining the shape, size, position, or the like of a graphic in each of the sub regions, and if the graphic cannot be written with a single shot, dividing the sub region into multiple partial regions each of which can be written with one shot. Note that the length of the short side (in the Y direction) of each stripe region is set to a length which allows the electron beam B to be deflected by primary deflection.

To write the above-described writing pattern, the writing control unit 3c write a graph by, while moving the stage 11 along the long side of the stripe region (X direction), placing the electron beam B on the sub region by using the main deflector 29 and shooting the electron beam B to a predetermined position on the sub region by using the secondary deflector 28. Once writing on one stripe region is completed, the writing control unit 3c moves the stage 11 in the Y direction by a step to write on the next stripe region. By repeating this, writing with the electron beam B is performed on the entire writing region on the sample W (an example of writing operation). Since the stage 11 is continuously moving in one direction during the writing, a writing origin on the sub region is tracked by the primary deflector 29 so that the writing origin follows the movement of the stage 11.

In this way, the irradiation position of the electron beam B is determined while the electron beam B is deflected by the secondary deflector 28 and the primary deflector 29 and follows the stage 11 moving continuously. Moving the stage 11 continuously in the X direction and causing the shot position of the electron beam B to follow the movement of the stage 11 allow reduction in writing time. Although the stage 11 is moved continuously in the X direction in this embodiment, the present invention is not limited to this. For example, a step-and-repeat writing method may be employed, in which writing for one sub region is performed with the stage 11 being stopped, and writing is not performed during movement to the next sub region.

Next, a description is given of the aperture unit (aperture holder) 31 incorporating the above-described second aperture 26.

Figure 3:
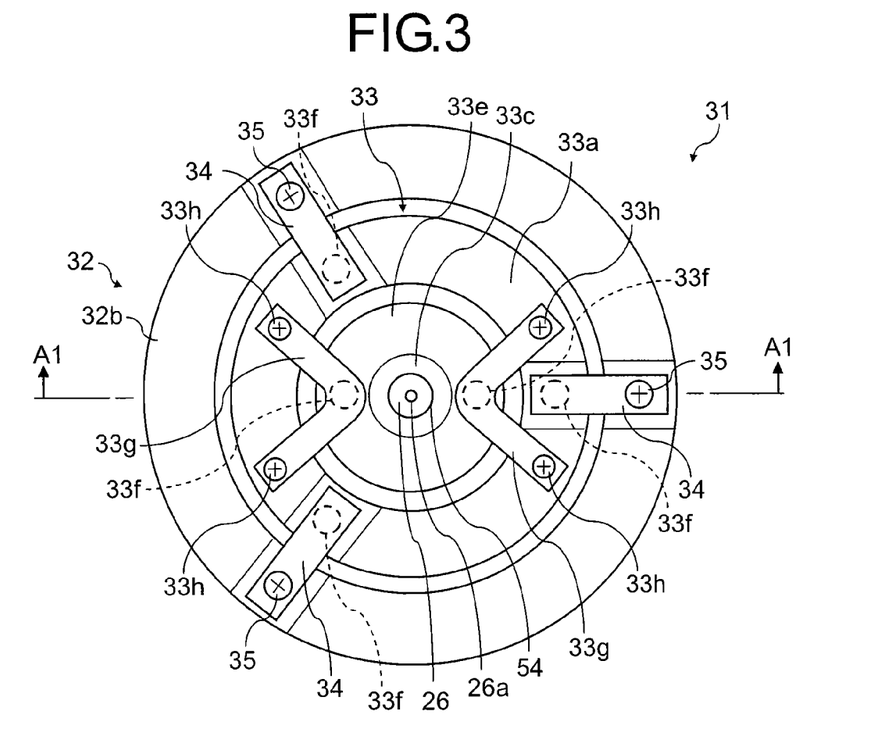
FIG. 3 is a plan view showing the schematic configuration of an aperture unit according to the embodiment.
Figure 4:
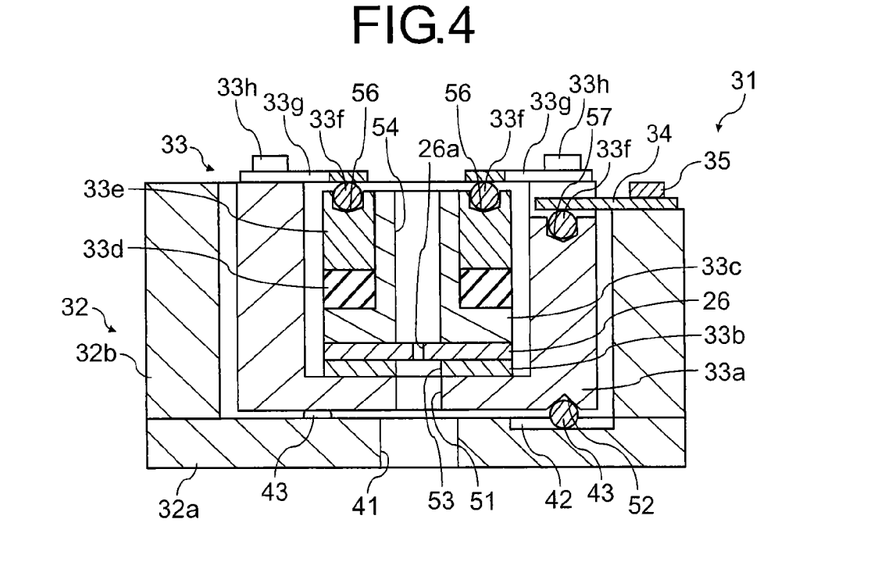
FIG. 4 is a sectional view taken along line A1-A1 shown in FIG. 3.

As shown in FIGS. 3 and 4, the aperture unit 31 includes an aperture holder 32, a main unit body 33 fitted inside the holder 32, multiple unit retaining members 34 configured to retain the main unit body 33, and multiple fixing members 35 each configured to fix a corresponding one of the unit retaining members 34 to the holder 32.

The holder 32 is formed by a plate-shaped holder base 32a and an annular holder ring 32b provided on the holder base 32a. The holder base 32a has an opening portion 41 through which the electron beam B passes. A material usable for the holder base 32a and the holder ring 32b is, for example, titanium or the like.

The holder 32 is formed to be able to be detachably attached to a predetermined position in the optical lens barrel 2b. Thereby, the aperture unit 31 is capable of being attached or detached along with the holder 32 by a special jig. The holder 32 can be replaced without being dismantled into parts if the columns such as the writing chamber 2a and the optical lens barrel 2b are under an atmospheric pressure.

Figure 5:
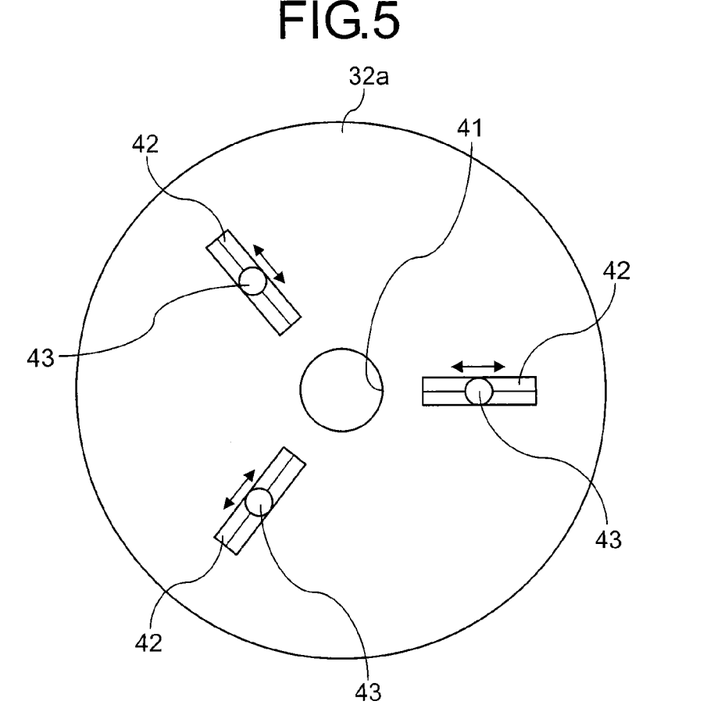
FIG. 5 is a plan view showing a holder base according to the embodiment.

Here, as shown in FIG. 5, a surface of the holder base 32a, i.e., the support surface thereof supporting the main unit body 33, has multiple (three in FIG. 5) grooves 42 which are V-shaped in section. Each of these grooves 42 is provided with a heat insulation ball 43 movable along the groove 42. Thus, the holder base 32a supports the main unit body 33 at three points (point contact). A material usable for the heat insulation balls 43 is one having lower thermal conductivity than other members, for example, zirconia, silicon nitride, or the like.

Referring back to FIGS. 3 and 4, the main unit body includes the second aperture 26 described earlier, an aperture base 33a, an aperture reinforcement plate 33b, an aperture beam tube 33c, a heater 33d, a heater retaining ring 33e, multiple heat insulation balls 33f, heater retaining members 33g, and fixing members 33h.

The aperture base 33a is formed into a columnar-box shape which is open at its upper portion, and has, at its bottom surface, an opening portion 51 through which the electron beam B passes. Multiple (e.g., three) hole portions 52 are formed at a lower surface of the aperture base 33a, i.e., a surface on the holder base 32a side. The hole portions 52 are placed above the respective heat insulation balls 43 on the holder base 32a and thereby provided on these heat insulation balls 43. Thus, the main unit body 33 is supported at three points by the heat insulation balls 43 (point contact). A material usable for the aperture base 33a is, for example, titanium or the like.

The aperture reinforcement plate 33b has an opening portion 53 through which the electron beam B passes, and is provided on an upper surface of the bottom portion of the aperture base 33a, i.e., a surface on the opposite side from the holder base 32a. This aperture reinforcement plate 33b is a plate member for reinforcing the second aperture 26. A material usable for the aperture reinforcement plate 33b is one which does not cause charge-up of the electron beam B and which has thermal conductivity close to that of the second aperture 26, for example, molybdenum, tungsten, or the like.

The aperture beam tube 33c is formed into a tubular shape having an opening portion 54 through which the electron beam B passes, and provided on an upper surface of the second aperture 26. The aperture beam tube 33c is formed by a tube portion and a flange portion. The aperture beam tube 33c functions as a thermally-conductive member having thermal conductivity, and transmits heat produced by the heater 33d to the second aperture 26. A material usable for the aperture beam tube 33c is one which does not cause charge-up of the electron beam B and which has thermal conductivity close to that of the second aperture 26, for example, molybdenum, tungsten, or the like.

The heater 33d is formed into a ring shape to be fitted around the tube portion of the aperture beam tube 33c, and is provided on the flange portion while being fitted around the tube portion of the aperture beam tube 33c. For example, a ceramic heater, a polyimide heater, or the like can be used as the heater 33d.

Figure 6:
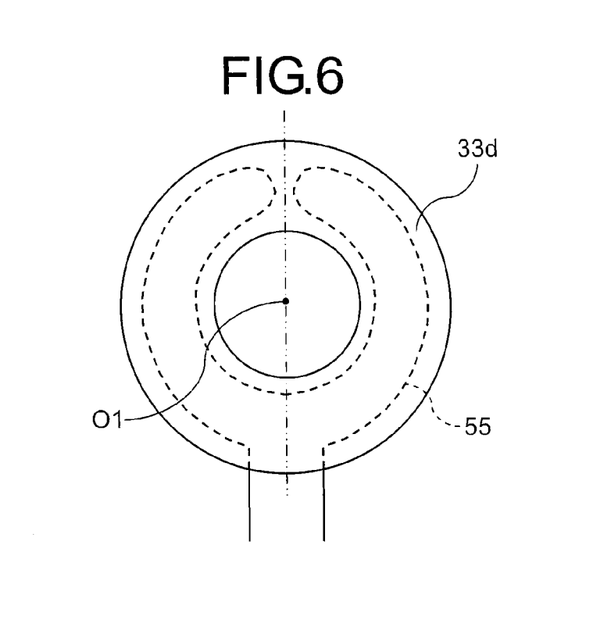
FIG. 6 is a plan view showing a heater according to the embodiment.

As shown in FIG. 6, the heater 33d has a single heating wire 55 inside. The heating wire 55 is laid along the ring shape of the heater 33d, and this wire pattern is symmetrical with respect to a straight line passing through a center O1 of the opening portion 26a of the second aperture 26. The heater 33d is formed by, for example, printing the heating wire 55 on either one of two insulating alumina plates and attaching these alumina plates together. Various materials other than the alumina plates can also be used for the heater 33d, including polyimide and the like.

Referring back to FIGS. 3 and 4, the heater retaining ring 33e is formed into a ring shape to be fitted around the tube portion of the aperture beam tube 33c, and is provided on the heater 33d while being fitted around the tube portion of the aperture beam tube 33c. The heater retaining ring 33e functions as a heater retaining block. A material usable for the heater retaining ring 33e is, for example, titanium or the like.

Multiple (two in FIG. 4) hole portions 56 are formed at an upper surface of the heater retaining ring 33e. These hole portions 56 are provided at symmetrical positions with respect to the center of the opening portion 54 of the aperture beam tube 33c. In addition, multiple (e.g., three) hole portions 57 are formed at portions of an upper surface of the aperture base 33a which are one step lower than its other portion. The portions at which the hole portions 57 are respectively formed are provided at equal intervals.

The heat insulation balls 33f are provided individually in the hole portions 56 on the heater retaining ring 33e and the hole portions 57 on the aperture base 33a, respectively. Each of these heat insulation balls 33f is fitted in a corresponding one of the hole portions 56 and the hole portions 57. A material usable for the heat insulation balls 33f is one having lower thermal conductivity than other members, for example, zirconia, silicon nitride, or the like.

Each of the heater retaining members 33g is formed into an L shape (see FIG. 3). Each heater retaining member 33g is fixed, at its both ends, to the upper surface of the aperture base 33a by two of the fixing members 33h. Then, with its middle portion, the heater retaining member 33g retains the heat insulation ball 33f on the heater retaining ring 33e (point contact). For example, plate springs or the like can be used as the heat retaining members 33g, and a material usable for the heat retaining members 33g is, for example, titanium or the like. For example, bolts can be used as the fixing members 33h.

Each unit retaining member 34 is formed into a rectangular plate shape (see FIG. 3). By the fixing member 35, the unit retaining member 34 is fixed, at one end, to a portion of the upper surface of the holder ring 32b which is one step lower than its other portion. Then, the unit retaining member 34 retains the heat insulation ball 33f on the aperture base 33a with the other end thereof (point contact). For example, plate springs or the like can be used as the unit retaining members 34, and a material usable for the unit retaining members 34 is, for example, titanium or the like. For example, bolts can be used as the fixing members 35.

Next, a description is given of writing operation (writing process) performed by the above charged particle beam writing apparatus 1. The writing control unit 3c of the charged particle beam writing apparatus 1 executes the writing process, namely, the following steps.

Figure 7:
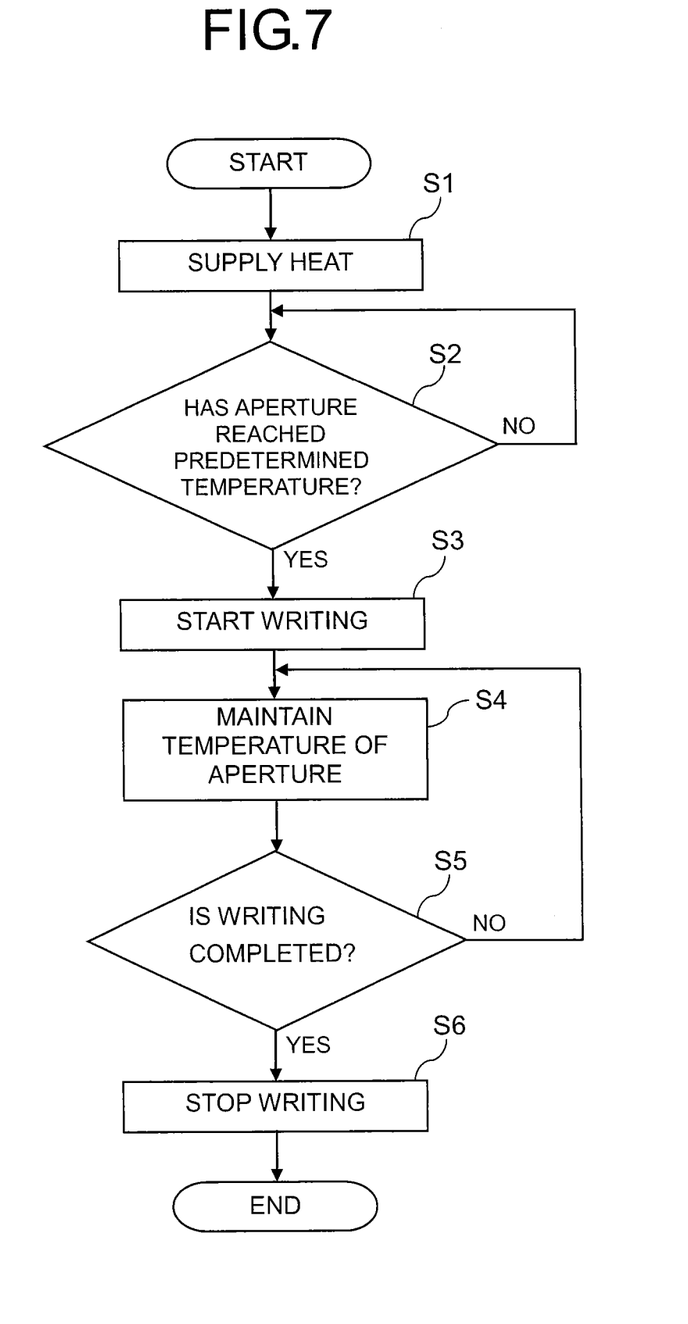
FIG. 7 is a flowchart showing a flow of a writing process according to the embodiment.

As shown in FIG. 7, the second aperture 26 is heated (Step S1), and it is determined whether the temperature of the second aperture has reached a predetermined temperature (e.g., 200° C.) or not (Step S2). This determination on whether the temperature of the second aperture 26 has reached a predetermined temperature or not is made based on time passed since start of the heating because it is found in advance how long it takes for the second aperture 26 to reach the predetermined temperature. This determination may be based not only on time, but also on the temperature of the second aperture 26 measured.

If it is determined in Step S2 that the temperature of the second aperture 26 has reached the predetermined temperature (YES in Step S2), writing is started (Step S3). Next, the temperature of the second aperture 26 is maintained at the above predetermined temperature (Step S4), and it is determined whether the writing is completed (Step S5). If it is determined that the writing is completed (YES in Step S5), the writing is stopped (Step S6).

In this writing process, in Step S1, currents are supplied to the heating wire 55 of the heater 33d in response to the control by the writing control unit 3c. The heating wire 55 thereby produces heat, and the heat produced is supplied to the second aperture 26 from the heater 33d via the aperture beam tube 33c. This heats the second aperture 26 up to a predetermined temperature. Thereafter, in Step S4, the second aperture 26 continues to be heated while the writing is being performed, so as to maintain the predetermined temperature. Note that the second aperture 26 continues to be heated up after the writing is completed if the next writing is to be executed, or the second aperture 26 is stopped being heated if the next writing will not be performed for a long time, for example, if the production is finished.

In such a charged particle beam writing apparatus 1, the first aperture 23 is irradiated with the electron beam B at its entire opening portion 23a, and therefore maintains a certain temperature. Thus, even a long time of use causes little contamination on the opening portion 23a. In contrast, as for the second aperture 26, the position irradiated with the electron beam B changes depending on the shape of a pattern to be written. Further, when the electron beam B is blanked, i.e., when the electron beam B is applied to the first aperture 23 so as not to pass through the opening portion 23a thereof, the electron beam B does not reach the second aperture 26. In such a case, the temperature of the second aperture 26 is reduced, making contamination likely to occur.

For this reason, the above-described structure of the aperture unit 31, or more specifically, the structure in which the second aperture 26 is heated by the heater 33d through the aperture beam tube 33c, allows the second aperture 26 to be heated to maintain a temperature of several-hundred degrees (e.g., 200° C.) and thus allows the opening portion 26a of the second aperture 26 to suffer less contamination.

A material usable for the aperture reinforcement plate 33b and the aperture beam tube 33c which sandwich and hold the second aperture 26 is molybdenum having a coefficient of thermal expansion close to that of the second aperture 26 made of silicon. This way, the second aperture 26 can be prevented from breaking while being heated.

Moreover, the second aperture 26 continues to be heated during writing to maintain a predetermined temperature (e.g., 200° C.). This ensures prevention of attachment of contaminants to the opening portion 26a of the second aperture 26 during writing, and therefore prevents the shape or size of the electron beam B from changing. Further, since the thermal expansion of the members such as the second aperture 26, the aperture reinforcement plate 33b, and the aperture beam tube 33c are maintained constant during the writing, the second aperture 26 being heated can be prevented from breaking due to the change in thermal expansion.

Since a large amount of current is needed to bring the temperature of the second aperture 26 to several hundred degrees (e.g., 200° C.), a magnetic field produced here is also large. Thus, the electron beam B might be affected by this magnetic field and deflect, displacing the writing position. For this reason, it is preferable to supply the second aperture 26 with an increased amount of heat so that the current supplied to the heater 33d can be as small an amount as possible. Thus, the employment of the structure in which the second aperture 26 is heated by the heater 33d via the aperture beam tube 33c can increase the area of contact between the heater 33d and the aperture beam tube 33c and also the area of contact between the aperture beam tube 33c and the second aperture 26 as much as possible. This enables an increase in the amount of heat supplied to the second aperture 26; therefore, the amount of current supplied to the heater 33d can be reduced even if that means a decrease in the amount of heat produced by the heater 33d.

An insulating ceramic heater can be used as the heater 33d. The heater 33d is surrounded by metal components therearound, such as the aperture beam tube 33c and the heater retaining ring 33e. This allows prevention of beam drift due to charge-up of the heater 33d. Moreover, since the heating wire 55 of the heater 33d is laid into a pattern symmetrical with respect to the straight line passing through the center O1 of the opening portion 26a of the second aperture 26, a magnetic field produced by the heating wire 55 is cancelled out, preventing the electron beam B from deflecting due to the magnetic field.

The main unit body 33 is preferably thermally insulated from its surroundings so that the temperature of the second aperture 26 can be easily increased to a necessary temperature (e.g., 200° C.). For this reason, the heat insulation balls 43 made of zirconia can be used as the above-described external-contact portions of the main unit body 33. This way, the contact between the main unit body 33 and the outside is accomplished by point contact, and therefore the area of contact is small, allowing the temperature of the second aperture 26 to easily increase to a high temperature of about 200° C.

As described thus far, according to this embodiment, the heater 33d provided supplies heat to the second aperture 26 via the aperture beam tube 33c. Thereby, the second aperture 26 is supplied with heat produced by the heater 33d via the aperture beam tube 33c and is heated. This can prevent contaminants from being attached to the opening portion 26a of the second aperture 26, which prevents the electron beam B from changing in its shape or size due to contamination on the aperture. As a result, decrease in the writing precision can be prevented.

In particular, since the heater 33d supplies heat to the second aperture 26 via the aperture beam tube 33c, the aperture beam tube 33c functions as a thermally conductive member, and the area of contact between the aperture beam tube 33c and the second aperture 26 can be made large. For this reason, the amount of heat supplied to the second aperture 26 can be increased to reduce the amount of current to be supplied to the heater 33d. This allows the temperature of the second aperture 26 to be brought to a high temperature (e.g., 200° C.) while the electron beam B is prevented from deflecting by being affected by the magnetic field produced by the heater 33d. This can ensure prevention of attachment of contaminants to the opening portion 26a of the second aperture 26. In addition, the degree of design freedom in the size, position, or the like of the heater 33d is improved, compared to a case where a heater (heating wire) is provided directly on the second aperture 26. For this reason, the amount of heat produced by the heater 33d can be increased while minimizing the amount of current to be passed to the heater 33d.

Moreover, since the second aperture 26 and the heater 33d are spaced from each other and not in direct contact with each other by the aperture beam tube 33c, currents for the heater 33d do not flow through the second aperture 26. Hence, no current flows through the second aperture 26 to produce a magnetic field. This allows prevention of the electron beam B deflecting due to such a magnetic field and causing shifting of the writing position. As a result, decrease in the writing precision can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charged particle beam writing apparatus comprising:
   a beam emitter configured to emit a charged particle beam;
   an aperture having an opening portion through which the charged particle beam emitted by the beam emitter passes;
   a thermally conductive member provided on a surface of the aperture and having thermal conductivity; and
   a heater provided on a surface of the thermally conductive member and configured to supply heat to the aperture via the thermally conductive member.

2. The charged particle beam writing apparatus according to claim 1, further comprising an aperture reinforcement plate provided on a surface of the aperture which is opposite to the surface on which the thermally conductive member is provided, the aperture sandwiched between the aperture reinforcement plate and the thermally conductive member.

3. The charged particle beam writing apparatus according to claim 1, wherein
   the heater incorporates a heating wire configured to produce heat, and
   the heating wire is laid into a pattern symmetrical with respect to a straight line passing through a center of the opening portion.

4. The charged particle beam writing apparatus according to claim 1, wherein
   the thermally conductive member is formed into a tubular shape having an opening portion through which the charged particle beam passes and has a tube portion and a flange portion, and
   the heater is formed into a ring shape to be fitted around the tube portion of the thermally conductive member, and is provided on the flange portion of the thermally conductive member while being fitted around the tube portion of the thermally conductive member.

5. The charged particle beam writing apparatus according to claim 4, further comprising a heater retaining block formed into a ring shape to be fitted around the tube portion of the thermally conductive member, and is provided on the heater while being fitted around the tube portion of the thermally conductive member.

6. The charged particle beam writing apparatus according to claim 1, further comprising:
   a main unit body including the aperture, the thermally conductive member, and the heater;
   a holder accommodating the main unit body;
   a plurality of unit retaining members provided to the holder and configured to retain the main unit body; and
   a plurality of heat insulation balls each being provided between the main unit body and a corresponding one of the plurality of unit retaining members.

7. The charged particle beam writing apparatus according to claim 6, further comprising a plurality of heat insulation balls provided between a bottom surface of the main unit body and the holder.

8. The charged particle beam writing apparatus according to claim 6, wherein
   the main unit body further includes a heater retaining block provided on the heater, and
   the apparatus further comprises:
      a plurality of heater retaining members provided to the main unit body and configured to retain the heater retaining block; and
      a plurality of heat insulation balls provided between the heater retaining block and a corresponding one of the plurality of heater retaining members.

9. The charged particle beam writing apparatus according to claim 7, wherein
   the main unit body further includes a heater retaining block provided on the heater, and
   the apparatus further comprises:
      a plurality of heater retaining members provided to the main unit body and configured to retain the heater retaining block; and
      a plurality of heat insulation balls provided between the heater retaining block and a corresponding one of the plurality of heater retaining members.

10. The charged particle beam writing apparatus according to claim 1, further comprising:
    a main unit body including the aperture, the thermally conductive member, the heater, and a heater retaining block provided on the heater;

a plurality of heater retaining members provided to the main unit body and configured to retain the heater retaining block; and a plurality of heat insulation balls provided between the heater retaining block and a corresponding one of the plurality of heater retaining members.

11. An aperture unit comprising:

an aperture having an opening portion through which a charged particle beam passes;

a thermally conductive member being provided on a surface of the aperture and having thermal conductivity; and a heater provided on a surface of the thermally conductive member and configured to supply heat to the aperture via the thermally conductive member.

12. The aperture unit according to claim 11, further comprising an aperture reinforcement plate provided on a surface of the aperture which is opposite to the surface on which the thermally conductive member is provided, the aperture sandwiched between the aperture reinforcement plate and the thermally conductive member.

13. The aperture unit according to claim 11, wherein the heater incorporates a heating wire configured to produce heat, and the heating wire is laid into a pattern symmetrical with respect to a straight line passing through a center of the opening portion.

14. The aperture unit according to claim 11, wherein the thermally conductive member is formed into a tubular shape having an opening portion through which the charged particle beam passes and has a tube portion and a flange portion, and the heater is formed into a ring shape to be fitted around the tube portion of the thermally conductive member, and is provided on the flange portion of the thermally conductive member while being fitted around the tube portion of the thermally conductive member.

15. The aperture unit according to claim 14, further comprising a heater retaining block formed into a ring shape to be fitted around the tube portion of the thermally conductive member, and is provided on the heater while being fitted around the tube portion of the thermally conductive member.

16. The aperture unit according to claim 11, further comprising:

a main unit body including the aperture, the thermally conductive member, and the heater;

a holder accommodating the main unit body;

a plurality of unit retaining members provided to the holder and configured to retain the main unit body; and a plurality of heat insulation balls each being provided between the main unit body and a corresponding one of the plurality of unit retaining members.

17. The aperture unit according to claim 16, further comprising a plurality of heat insulation balls provided between a bottom surface of the main unit body and the holder.

18. The aperture unit according to claim 16, wherein the main unit body further includes a heater retaining block provided on the heater, and the aperture unit further comprises:

a plurality of heater retaining members provided to the main unit body and configured to retain the heater retaining block; and a plurality of heat insulation balls provided between the heater retaining block and a corresponding one of the plurality of heater retaining members.

19. The aperture unit according to claim 11, further comprising:

a main unit body including the aperture, the thermally conductive member, the heater, and a heater retaining block provided on the heater;

a plurality of heater retaining members provided to the main unit body and configured to retain the heater retaining block; and a plurality of heat insulation balls provided between the heater retaining block and a corresponding one of the plurality of heater retaining members.

* * * * *